United States Patent [19]
Chia et al.

[11] Patent Number: 6,143,586
[45] Date of Patent: Nov. 7, 2000

[54] ELECTROSTATIC PROTECTED SUBSTRATE

[75] Inventors: Chok J. Chia, Capertino; Patrick Variot, San Jose; Qwai H. Low, Cupertino, all of Calif.

[73] Assignee: LSI Logic Corporation, Milpitas, Calif.

[21] Appl. No.: 09/097,882

[22] Filed: Jun. 15, 1998

[51] Int. Cl.[7] .......................... H01L 21/44; H01L 21/48; H01L 21/50; H01L 21/82; H01L 21/336; H01L 21/331; H01L 31/479

[52] U.S. Cl. .................. 438/106; 438/119; 438/131; 438/281; 438/292; 438/293; 438/333; 438/351; 438/466

[58] Field of Search ...................... 438/106, 119, 438/131, 281, 292, 293, 333, 351, 466

[56] References Cited

U.S. PATENT DOCUMENTS 5,023,202  6/1991  Long et al. .
5,661,087  8/1997  Pedersen et al. .
5,913,137  6/1999  Chen .
5,960,290  9/1999  Hsu .

*Primary Examiner*—Jey Tsai
*Assistant Examiner*—Josetta Jones

[57] ABSTRACT

An electrostatic protected integrated circuit (IC) substrate and a method of making an integrated circuit package with the electrostatic protected IC substrate includes an IC substrate, having a plurality of electrical traces formed on the top of the IC substrate with the electrical traces extending from an IC chip mounting area near the center to the periphery of the IC substrate. Electrically shorting the electrical traces together with a conductive material such as conductive tape or epoxy, thereby, protecting the IC substrate against the accumulation of static charges during the assembly of the IC chip on the IC substrate. The IC chip is mounted in the mounting area on the IC substrate and the conductive material is removed before final testing.

13 Claims, 2 Drawing Sheets

ELECTROSTATIC PROTECTED SUBSTRATE

BACKGROUND OF THE INVENTION

The present invention relates to integrated circuit packages, and more particularly to a method of protecting the integrated circuit package from static electricity during the assembly process.

In the last few decades, the electronics industry has literally transformed the world. Electronic devices are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip, and the more efficient packaging of the IC chip, have played a key role in the success of these devices.

One of the most serious dangers to the electronics is static. In the electronic fabrication areas, static is controlled primarily to prevent the attraction of particles to the wafer surface. But the greatest concern is electrostatic discharge, or ESD. Static charge can build up to levels of tens of thousands of volts. If this voltage is suddenly discharged onto an IC chip surface, it can easily destroy all or a portion of the integrated circuit.

The integrated circuit (IC) device with its IC chip and embedded circuitry are delicate, and must be protected. Particularly, the IC device is susceptible to damage from static electricity. From the manufacturing processes through use of the IC device, special precautions are taken to prevent static electricity charges from contacting the IC chip and damaging it.

These precautions may include the operators use of grounding straps and nonstatic smocks; the use of antistatic carrier material; moving by lifting rather than sliding; and grounding equipment, work surfaces and floor mats.

The current method of dissipating static charge is by blowing ionized air onto the package at various stages of the assembly process. However, in some areas of the assembly and in some equipment, it is not possible to blow ionized air onto the package. Also, the amount of static charge removed by ionized air is difficult to measure.

Plastic packages are particularly susceptible to static charges that collect on the package surface during the manufacturing process. In most packages, all the metal leads, traces and contacts are connected to each other and to the ground of the device. The ground of the device is then regularly connected to an electrical ground in the equipment to dissipate any charge that collects in the device or package.

In some packages, the traces need to be separated after manufacturing and before the chip is attached to allow for the testing of the package and to remove defects. In these type of packages, that are no means of dissipating any of the static charges that may accumulate in the package. For example, in the process of manufacturing the IC substrate for plastic ball grid array (PBGA) packages, shorts and opens in the traces are present and need to be sorted and removed. This is done to avoid mounting a good device chip on a defective package. The plating busses are usually isolated from the traces for this purpose. However, these isolated traces in the package can collect static electricity during assembly of the package and when the chip is mounted and connected to the package, the chip can be damaged by this static electricity.

In view of the above, it is evident that what is needed is a means of providing an electrical connection to ground within the package during the assembly process in order to prevent static electricity from accumulating, and at the same time allow for testing of the package IC substrate and the device after assembly.

SUMMARY OF THE INVENTION

The present invention addresses the above and other needs by providing an electrostatic protected IC substrate for an integrated circuit package that protects the IC chip from electrostatic discharge. The IC substrate is manufactured with metal traces formed on the surface. The traces extend radially out from the central or inner section to the outer edge of the IC substrate. The central or inner section is where the integrated circuit (IC) chip is mounted. The conductive traces are covered by a solder resist.

Along the edges of the IC substrate, the solder resist is removed, exposing the traces. At the inner end of each of the traces, near the central or inner section, the traces are exposed for wire bonding to the IC chip. The traces are isolated from each other and are electrically tested individually for the shorts and opens in the IC substrate.

During the assembly process, prior to mounting the IC chip, a conductive tape or epoxy is attached to the exposed traces along the edge, where the solder resist has been removed. The conductive tape or epoxy electrically shorts all the traces together and to the ground traces. The conductive tape or epoxy is left on the traces of the IC substrate to protect against accumulation of static charges in the package throughout the assembly process. The conductive tape or epoxy is removed just before final electrical testing of the assembled device.

In an alternate embodiment, the conductive tape or epoxy is applied to the traces in the non-functioning area of the IC substrate, such as along the periphery of the IC substrate, which are trimmed off after assembly. The conductive tape or epoxy shorts all the traces together and to the ground traces. After the IC chip is attached, the non-functioning area is removed just before testing, thereby, removing the conductive tape or epoxy at the same time.

BRIEF DESCRIPTION OF THE DRAWINGS

The above and other aspects, features and advantages of the present invention will be more apparent from the following more particular description thereof, presented in conjunction with the following drawings wherein.

Below is a list of reference numbers associated with the figures.

| No. | Component |
|---|---|
| 10 | Integrated Circuit Substrate |
| 15 | Traces |
| 20 | IC substrate Edge |
| 25 | Solder Resist |
| 30 | Central Section of the IC Substrate |

-continued

| No. | Component |
|---|---|
| 35 | Integrated Circuit Chip |
| 40 | Bond Fingers |
| 45 | Wire Bond |
| 50 | Conductive Tape |
| 55 | Conductive Epoxy |
| 60 | Conductive Tape |
| 65 | Conductive Epoxy |
| 70 | Non-Functioning Area of IC Substrate |
| 75 | Integrated Circuit Package |
| 80 | Mold Cap |

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
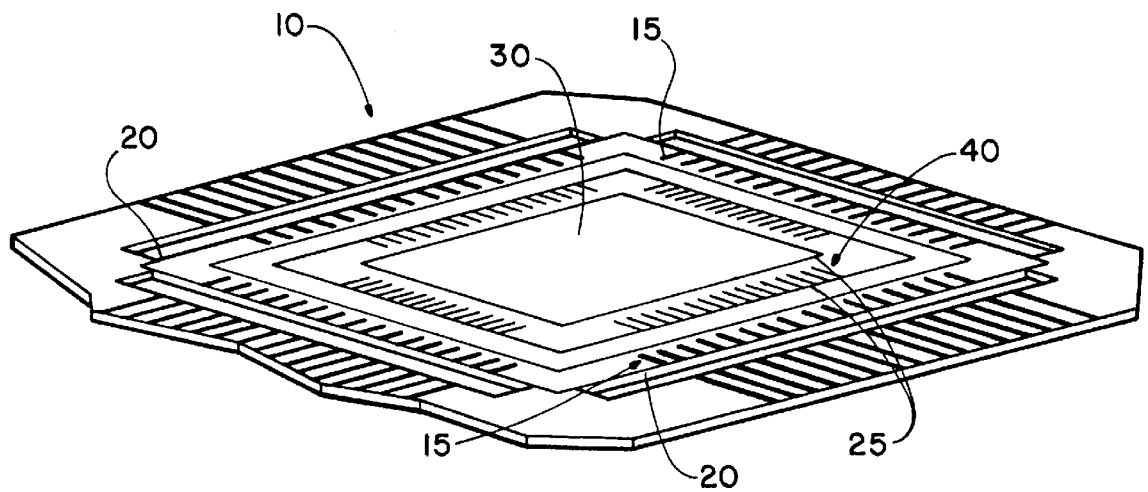
FIG. 1 is an isometric view of an integrated circuit (IC) substrate.

FIG. 1 shows an isometric view of an integrated circuit (IC) substrate 10. The IC substrate 10 is made in the conventional method that is known in the art. The IC substrate 10 is made from a nonconductive material such as a ceramic or plastic material, for example: Kapton, polyimide or PVC. The IC substrate 10 includes a central or inner section 30 wherein an integrated circuit (IC) chip 35 will be mounted. Located on the top surface of the IC substrate 10 are a plurality of conductive traces 15. The traces 15 are made from conductive material such as copper, or copper plated with gold or silver. The traces 15 extend radially out from the central or inner section 30 to the outer edge 20 of the IC substrate 10. The conductive traces are covered by a solder resist 25.

Along the edges 20 of the IC substrate 10, the solder resist 25 is removed, exposing the traces 15 for attachment to an electronic package (not shown). Note, at the edge 20 such traces 15 are relatively wide. Additionally, along the edges of the central or inner section 30, the resist 25 is also removed, exposing bonding fingers 40 of the traces 15. These bonding fingers 40 are used for wire bonds 45 the IC chip 35 to the IC substrate 10, and such fingers 40 are much narrower than the traces 15. The traces 15 are isolated from each other and are electrically tested individually for the shorts and opens in the IC substrate.

Figure 2:
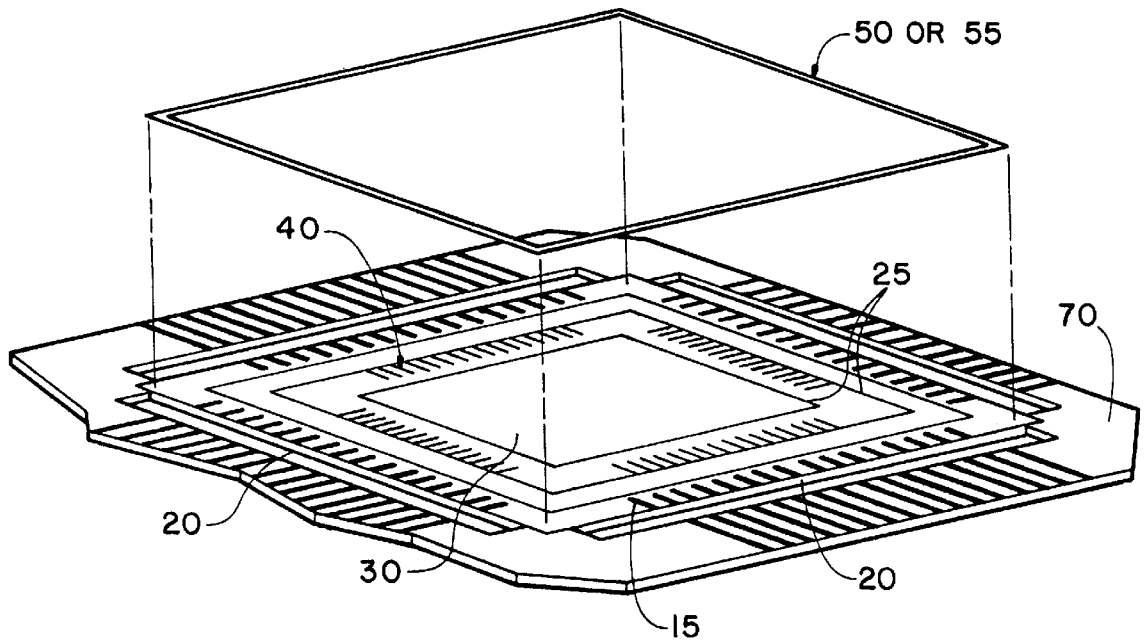
FIG. 2 is an isometric view of an integrated circuit substrate with the application of the conductive tape to the exposed traces.

Next, referring to FIG. 2, during the assembly process, prior to mounting the IC chip 35 onto the central or inner section 30 of the IC substrate 10, a conductive tape 50 is attached to the exposed traces 15 along the edge 20, where the solder resist 25 has been removed. The conductive tape 50 electrically shorts all the traces 15 together and to the ground traces. The conductive tape 50 is left on the traces 15 of the IC substrate 10 to protect against accumulation of static charges in the package throughout the assembly process. The conductive tape 50 is remove before final electrical testing of the assembled device.

Figure 3:
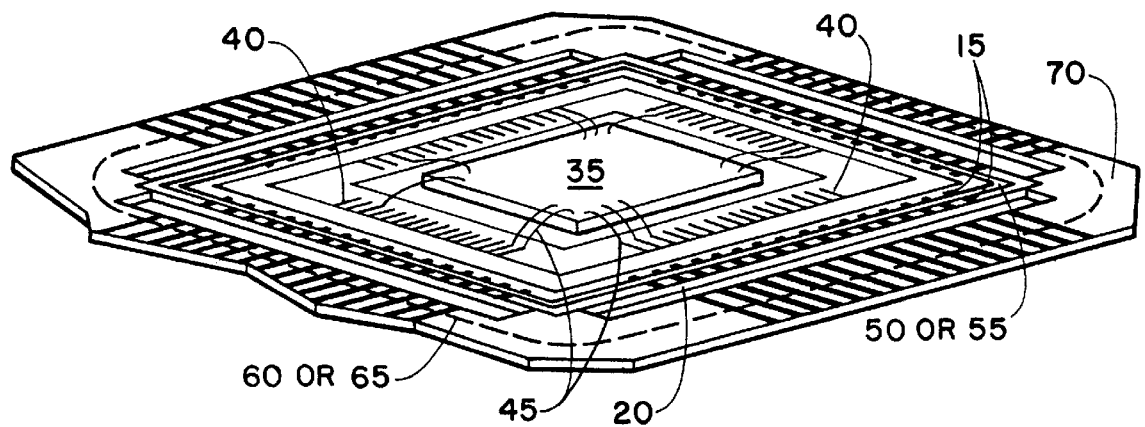
FIG. 3 is an isometric view of an integrated circuit package with an integrated circuit chip attached.

FIG. 3 shows the attachment of the IC chip 35 to the IC substrate 10. The IC chip 35 is secured to the center section of the IC substrate 10, e.g., within the central or inner section 30, by cement or other suitable means of physical attachment, as is known in the art. The IC chip 35 is then electrically attached to the bonding fingers 40 by wire bonds 45 in a conventional manner.

Figure 4:
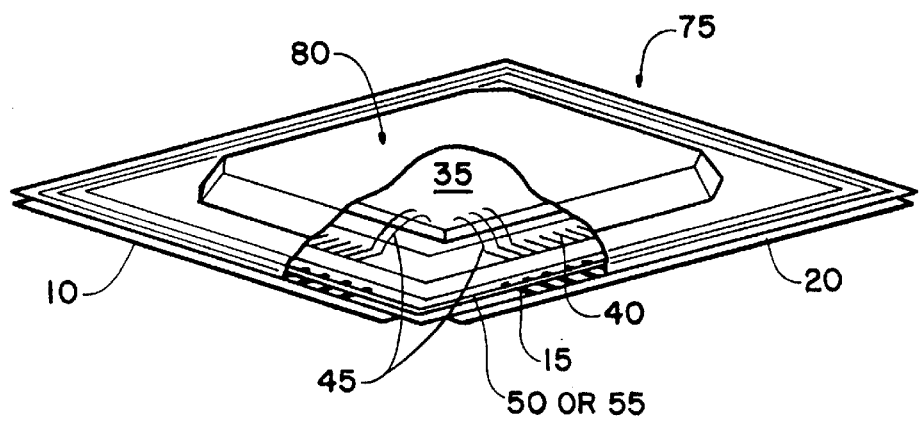
FIG. 4 is an isometric view of an IC package with a cap protecting the IC chip and conductive tape or epoxy shorting the exposed traces.

FIG. 4 shows the final integrated circuit (IC) package 75 with an electrostatic protected IC substrate 10. As seen in FIG. 4, the integrated circuit chip 30 has been mounted onto the central or inner section 30 of the package IC substrate 10 and electrically attached to the bonding fingers 40 of the IC substrate 10 with wire bonds 45. A mold cap 80 is then attached to cover and protect the IC chip 35 and wire bonds 45. Note in FIG. 4 that the IC substrate 10 has been trimmed to remove a non-functioning area 70.

In a second embodiment, a conductive epoxy 55 is used instead of the conductive tape 50. The conductive epoxy 55 is applied to the exposed traces 15 along the edge 20 of the IC substrate 10, where the solder resist 25 has been removed. The conductive epoxy 55 shorts all the traces 15 together and to the ground traces. The conductive epoxy 55 is removed before final electrical testing of the assembled device.

An alternative embodiment exposes the traces 15 by removing the resist 25 in a non-functioning area 70 of the IC substrate 10. A conductive tape 60 or conductive epoxy 65 is applied to the exposed traces 15 in the non-functioning area 70 (this is shown as dashed lines along the edge of IC substrate 10 in FIG. 3). The conductive tape 60 or epoxy 65 shorts all the traces 15 together and to the ground traces. After the IC chip 35 is attached, the non-functioning area 70 is removed before testing, removing the conductive tape 60 or epoxy 65 at the same time. It is envisioned that the removal of the non-functioning area 70 is done by trimming the part with a saw.

Advantageously, use of the present invention by the assembly manufacturer protects the electronic device from electrostatic damage during the assembly process for IC substrate-based packages. This invention provides for an electrostatic protected package which improves the yield of the electronic device during assembly.

The number and arrangement of the traces 15 in the figures is meant to teach the present invention, but is not necessarily meant to show the actual number and arrangement of the traces that may be used in an IC package. Additionally, other conductive materials may be used to electrically short the traces together other than conductive tape or conductive epoxy.

While the invention herein disclosed has been described by means of specific embodiments and applications thereof, numerous modifications and variations could be made thereto by those skilled in the art without departing from the scope of the invention set forth in the claims.

What is claimed is:

1. A method of making an integrated circuit (IC) package with an electrostatic protected IC substrate, said method comprising:

(a) selecting an IC chip, the IC chip having contact pads on one surface thereof;

(b) providing an IC substrate;

(c) forming a plurality of conductive traces on a first surface of the IC substrate;

(d) forming a layer of solder resist over said plurality of conductive traces;

(e) removing a portion of the layer of solder resist exposing a portion of said conductive traces;

(f) electrically shorting the exposed portion of said conductive traces together with a conducting material to ground the traces;

(g) attaching the IC chip to the first surface of the IC substrate; and (h) electrically connecting the contact pads of the IC chip to the conductive traces, thereby making an IC package with an electrostatic protected IC substrate.

2. The method of claim 1 further comprising the step of:

(g) removing the conductive material before final electrical testing of the IC package.

3. A method of making an integrated circuit (IC) package as in claim 2 wherein said step (f) of electrically shorting said exposed portion of conductive traces with a conducting material includes electrically shorting said traces with a readily removable conducting material.

4. A method of making an integrated circuit (IC) package as in claim 3 wherein said readily removable conducting material includes a electrically conductive tape.

5. A method of making an integrated circuit (IC) package as in claim 3 wherein said readily removable conducting material includes a electrically conductive epoxy.

6. A method of making an integrated circuit (IC) package with an electrostatic protected IC substrate, said method comprising:

(a) selecting an IC chip, the IC chip having contact pads on one surface thereof;

(b) providing an IC substrate;

(c) forming a plurality of conductive traces on a first surface of the IC substrate;

(d) forming a layer of solder resist over said plurality of conductive traces;

(e) removing a portion of the layer of solder resist exposing a portion of said conductive traces;

(f) electrically shorting the exposed portion of said conductive traces together by adhering an easily removed conductive material to the traces;

(g) attaching the IC chip to the first surface of the IC substrate; and (h) electrically connecting the contact pads of the IC chip to the conductive traces, thereby making an IC package with an electrostatic protected IC substrate.

7. The method of claim 6 wherein said step (f) of electrically shorting the exposed portion of said conductive traces together includes shorting said traces together by adhering an electrically conducting tape to said traces.

8. The method of claim 7 further comprising the step of:

(i) removing the tape before final electrical testing of the IC package.

9. The method of claim 6 wherein said step (f) of electrically shorting the exposed portion of said conductive traces together includes shorting said traces together by adhering an electrically conducting epoxy to said traces.

10. The method of claim 9 further comprising the step of:

(i) removing the epoxy before final electrical testing of the IC package.

11. A method of making an integrated circuit (IC) package with an electrostatic protected IC substrate, said method comprising:

(a) selecting an IC chip, the IC chip having contact pads on one surface thereof;

(b) providing an IC substrate having a first surface including a inner section and a non-functioning area;

(c) forming a plurality of conductive traces on said first surface of the IC substrate;

(d) forming a layer of solder resist over the conductive traces;

(e) removing said layer of solder resist from the non-functioning area;

(f) electrically grounding the conductive traces by shorting the conductive traces together across the non-functioning area with an electrically conductive material;

(g) attaching the IC chip to the inner section of the IC substrate;

(h) electrically connecting the contact pads of the IC chip to the conductive traces; and (i) removing the non-functioning area and the electrically conductive material at the same time and before final electrical testing of the IC package.

12. The method of claim 11 wherein said step of electrically grounding the conductive traces by shorting the conductive traces together includes shorting said traces with an electrically conducting tape.

13. The method of claim 11 wherein said step of electrically grounding the conductive traces by shorting the conductive traces together includes shorting said traces with an electrically conducting epoxy.

* * * * *